United States Patent
Kunimoto et al.

(10) Patent No.: US 8,399,977 B2
(45) Date of Patent: Mar. 19, 2013

(54) RESIN-SEALED PACKAGE AND METHOD OF PRODUCING THE SAME

(75) Inventors: Yuji Kunimoto, Nagano (JP); Akihiko Tateiwa, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 179 days.

(21) Appl. No.: 12/644,407

(22) Filed: Dec. 22, 2009

(65) Prior Publication Data

US 2010/0155925 A1 Jun. 24, 2010

(30) Foreign Application Priority Data

Dec. 24, 2008 (JP) ................................ 2008-328365

(51) Int. Cl.
*H01L 23/48* (2006.01)

(52) U.S. Cl. ........ 257/690; 257/773; 257/778; 257/787; 257/782; 257/780; 257/E23.005; 257/E23.01; 257/E23.023; 257/E23.124; 257/E23.133; 257/E23.135; 257/E23.136; 257/E23.194; 257/E21.503; 438/118; 438/126; 438/127; 29/832; 174/260

(58) Field of Classification Search .................. 257/690, 257/796, E23.087, 780, E23.135, E23.136, 257/773, 778, 787, E23.005, E23.01, E23.023, 257/E23.124, E23.133, E23.194, E21.503; 174/260; 29/840–843, 831, 832, 836; 438/118, 438/126, 127

See application file for complete search history.

(56) References Cited

U.S. PATENT DOCUMENTS

| | | | | |
|---|---|---|---|---|
| 6,586,836 B1 * | 7/2003 | Ma et al. | ...................... | 257/723 |
| 6,757,967 B2 * | 7/2004 | Jimarez et al. | .................. | 29/840 |
| 7,053,635 B2 * | 5/2006 | Kazama et al. | .......... | 324/756.05 |
| 7,151,014 B2 * | 12/2006 | Manepalli et al. | ............ | 438/127 |
| 7,370,411 B2 * | 5/2008 | Yamano | .......................... | 29/832 |
| 7,851,906 B2 * | 12/2010 | Alcoe et al. | ................... | 257/713 |
| 7,852,634 B2 | 12/2010 | Sakamoto et al. | | |

(Continued)

FOREIGN PATENT DOCUMENTS

| | | |
|---|---|---|
| JP | 2001-352021 | 12/2001 |
| JP | 2002-246757 | 8/2002 |

(Continued)

*Primary Examiner* — Fernando L Toledo
*Assistant Examiner* — Victoria K Hall
(74) *Attorney, Agent, or Firm* — Rankin, Hill & Clark LLP

(57) ABSTRACT

A method of producing a resin-sealed package is provided with: providing an electronic component which has a plurality of terminals on one face, a first support member and a second support member; temporarily fixing said electronic component to a surface of said first support member by a first adhesive agent layer, to face said terminals with said first support member; fixing said second support member having a second adhesive agent layer to said electronic component while interposing said electronic component between said first support member and said second support member to face said second adhesive agent layer with a back face side of said electronic component; resin sealing said electronic component between said first support member and said second support member; peeling said first support member and said first adhesive agent layer from said electronic component and a sealing resin; and stacking an insulating resin layer and a wiring layer which is electrically connected to said terminals of said electronic component, on said electronic component and said sealing resin.

8 Claims, 3 Drawing Sheets

U.S. PATENT DOCUMENTS

| | | | |
|---|---|---|---|
| 7,906,860 B2* | 3/2011 | Meyer et al. | 257/790 |
| 8,324,020 B2* | 12/2012 | Eichelberger et al. | 438/106 |
| 2004/0033673 A1* | 2/2004 | Cobbley et al. | 438/455 |
| 2004/0124515 A1* | 7/2004 | Tao et al. | 257/684 |
| 2005/0179213 A1* | 8/2005 | Huang et al. | 277/620 |
| 2006/0038281 A1* | 2/2006 | Colgan et al. | 257/706 |
| 2007/0042166 A1* | 2/2007 | Chung et al. | 428/209 |
| 2007/0052091 A1 | 3/2007 | Weekamp et al. | |
| 2008/0032447 A1* | 2/2008 | Lee | 438/106 |
| 2008/0266806 A1* | 10/2008 | Lakin et al. | 361/709 |
| 2009/0283881 A1* | 11/2009 | Wang et al. | 257/676 |
| 2010/0109169 A1* | 5/2010 | Kolan et al. | 257/787 |
| 2010/0139962 A1* | 6/2010 | Kaneko | 174/260 |

FOREIGN PATENT DOCUMENTS

JP    2006-511085    3/2006

* cited by examiner

RESIN-SEALED PACKAGE AND METHOD OF PRODUCING THE SAME

This application claims priority from Japanese Patent Application No. 2008-328365, filed on Dec. 24, 2008, the entire contents of which are hereby incorporated by reference.

FIELD OF THE INVENTION

The present invention relates to a semiconductor package, and more particularly to a resin-sealed package which can be used as a package for a semiconductor integrated circuit in general, and a method of producing the package.

DESCRIPTION OF RELATED ART

In a resin-sealed package, usually, one or a plurality of electronic components such as active or passive devices are fixed by a sealing resin or the like. A wiring layer and an insulating resin layer are stacked on each of the active or passive devices.

In the case where such a resin-sealed package in which a signal or a plurality of active or passive devices are mounted is to be produced, a producing method is sometimes employed in which a support member is used, devices are mounted on the support member through an adhesive agent layer, the devices are sealed by a resin, a wiring layer and an insulating resin layer are stacked, and then the support member is removed, thereby completing the resin-sealed package.

In a method of producing a resin-sealed package in which a support member is used as described above, in the case where a plurality of active or passive devices are to be mounted on the support member, a sealing process must sometimes be performed while terminal faces of the devices are aligned in the same plane. A related-art method of producing a usual resin-sealed package in such a case will be described.

FIGS. 1A to 1E show a related-art technique in the case where a plurality of electronic components such as active or passive devices are mounted on a support member, and sealed by a resin to be incorporated into a package. The related-art technique is an example of the case where alignment in the same plane is performed while using the terminal faces of the active or passive devices as the reference.

Referring to FIG. 1A, first, a passive device 12, active devices 14, 16, and the like are mounted on a support member 10 through an adhesive agent 20. Terminals 12a, 14a, 16a of the passive device 12 and the active devices 14, 16 are positioned on the upper face of the support member 10.

Referring to FIG. 1B, next, the components on the support member 10, such as the passive device 12 and the active devices 14, 16 are sealed by a resin 22. There is a possibility that the pressure in injection of the resin 22 may cause the components to be positionally displaced, or that the incorporation of the resin 22 may contaminate the terminals 12a, 14a, 16a.

Referring to FIG. 1C, then, the resin 22 cures and shrinks, and thereafter the support member 10 is peeled away. There is a possibility that the curing and shrinking of the sealing resin may produce asperities in the front face, or that the peeling of the support member 10 may cause the resin surface to warp.

Referring to FIG. 1D, then, vias 26 are formed in a resin layer 24, and a wiring pattern (wiring layer) 28 which is connected to the vias 26 is formed on the resin layer 24. As shown in FIG. 1E, thereafter, resin layers 24 and wiring layers 28 are alternately stacked to form the package as a multilayer structure.

Referring to FIG. 1E, on the outermost surface of the package, a solder resist 30 and the like are formed, and external terminals 32 for external connection are formed, thereby completing the package.

Referring to FIG. 1E showing the completed resin-sealed package, the surfaces of the terminals 12a, 14a, 16a of the passive device 12 and the active devices 14, 16 are aligned with a predetermined plane which is defined by the support member 10. In the case where the passive device 12 and the active devices 14, 16 include a heat-radiating component, the sealing resin 22 on the back face of the heat-radiating electronic component is peeled so that the back face of the component is exposed. As required, a heat sink (not shown) or the like is connected to the back face of the component from which the sealing resin is peeled.

In the above-described related-art method of producing a resin-sealed package, in view of the necessity of peeling the support member from the package including devices in a subsequent step, temporary bonding between the support member and the devices may be previously made weak. In this case, in a process in which resin sealing is performed after the devices are temporarily bonded to the support member, the resin may enter between the terminals and the support member to contaminate the terminals, or the pressure in injection of the resin may cause the positions of the devices to displace from predetermined positions with respect to the support member.

Conversely, when temporary bonding between the support member and the devices is made stronger, the adhesive agent itself adheres the terminals. Because of curing and shrinking of the sealing resin or the like, asperities are produced in the terminal faces, and the terminal faces are not flat. Since the support member is peeled, warpage is produced in the package, and the terminal faces are not flat. In the case where a heat-radiating component is added to the back face of a device, the sealing resin on the back face must be removed by polishing or the like to again expose the back face of the device.

U.S. Pat. No. 6,586,836 discloses a method of producing a resin-sealed package. In the method, with respect to a first sealing structure which includes at least resin-sealed microelectronic components, and which has an active face and a back face, and a second sealing structure which has a similar structure, the back faces of the structures are bonded to each other by using an adhesive agent, and stacked members each consisting of an insulating layer and a wiring layer are simultaneously formed on the active face sides of the sealing structures by the build-up method, respectively. If required, thereafter, the first and second sealing structures are separated from each other. According this method, in the state where the back faces of the first and second sealing structures are bonded to each other, the stacked members each consisting of an insulating layer and a wiring layer are formed on the active face sides of the sealing structures by the build-up method, respectively.

In the related-art method of producing a resin-sealed package, the support member does not have a vertically symmetrical structure, and hence warpage is produced in the package. Even after the support member is peeled away, residual stress remains in the resin, and hence warpage cannot be eliminated.

In the related-art method of producing a resin-sealed package, because of asperities of the resin and warpage, an insulating resin which is later formed cannot be made flat. Therefore, accurate formation of wirings is hardly performed and the pitch of wirings is impeded from being made fine.

SUMMARY OF INVENTION

Illustrative aspects of the present invention provide a resin-sealed package in which terminal faces of one or a plurality of electronic components constituting the package are set at a uniform level, and the electronic components are fixed and resin-sealed in a state where they are vertically interposed between support members, whereby generation of warpage of a sealing resin and distortion is eliminated or reduced, so that positional displacement of the electronic components, distortion, and the like are eliminated, and also a method of producing such a package.

According to a first aspect of the invention, a method of producing a resin-sealed package is provided with: providing an electronic component which has a plurality of terminals on one face, a first support member and a second support member; temporarily fixing said electronic component to a surface of said first support member by a first adhesive agent layer, to face said terminals with said first support member; fixing said second support member having a second adhesive agent layer to said electronic component while interposing said electronic component between said first support member and said second support member to face said second adhesive agent layer with a back face side of said electronic component; resin sealing said electronic component between said first support member and said second support member; peeling said first support member and said first adhesive agent layer from said electronic component and a sealing resin; and stacking an insulating resin layer and a wiring layer which is electrically connected to said terminals of said electronic component, on said electronic component and said sealing resin.

Other aspects and advantages of the invention will be apparent from the following description, the drawings and the claims.

DETAILED DESCRIPTION OF EXEMPLARY EMBODIMENTS

Hereinafter, an exemplary embodiment of the present invention will be described in detail with reference to the accompanying drawings.

FIGS. 2A to 2D and 3A to 3C show an embodiment of the method of producing a resin-sealed package according to the present invention.

Referring to FIGS. 2A to 2D and 3A to 3C, electronic components such as a passive device 12 and active devices 14, 16 have a plurality of electrode terminals 12a, 14a, 16a on their respective one flat faces (first faces), respectively, and the other faces (second faces) which are the back faces are formed into a flat face that is parallel to the first faces. The surface of the electrode terminal 12a, 14a, or 16a of each of the electronic components is formed so as to be located in a constant plane which is set for each of the electronic component.

Figure 1A:
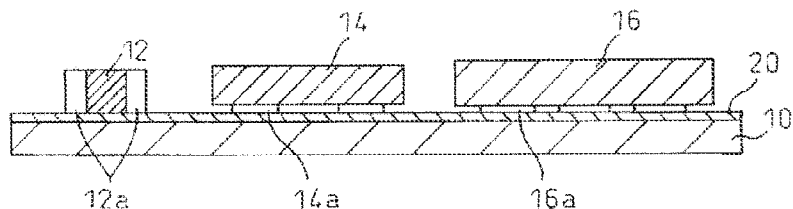
FIGS. 1A to 1E are process step diagrams showing a related-art method of producing a resin-sealed package.
Figure 1B:
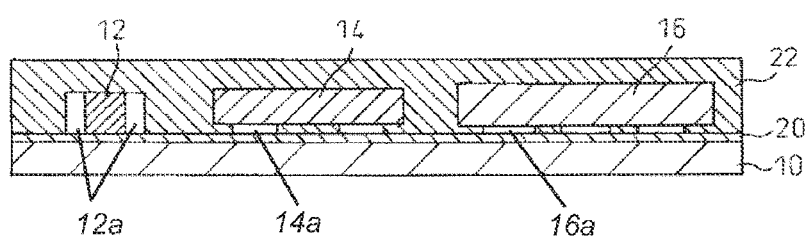
Figure 1C:
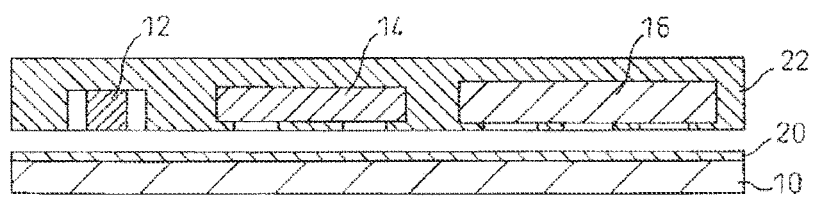
Figure 1D:
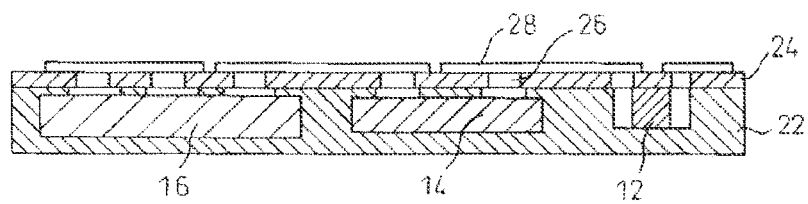
Figure 1E:
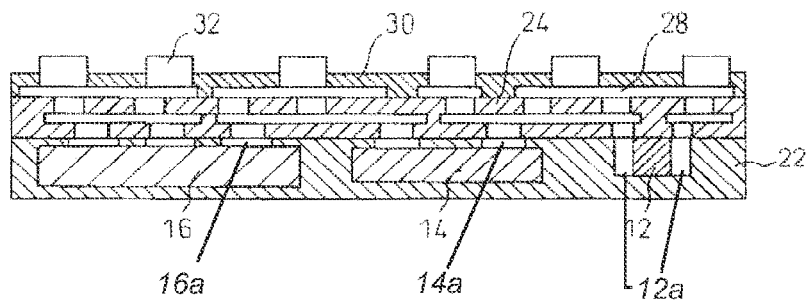
Figure 2A:
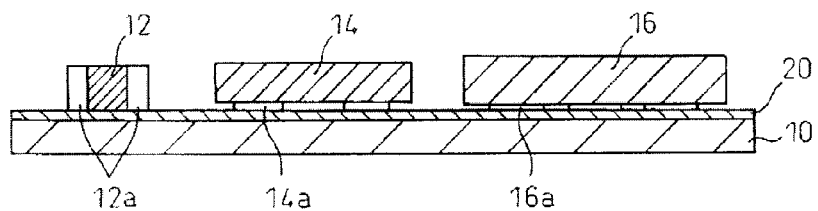
FIGS. 2A to 2D are process step diagrams showing the method of producing a resin-sealed package of the present invention.

Referring to FIG. 2A, the passive device 12, the active devices 14, 16, and the like are mounted on a first support member 10 through an adhesive agent layer 20. The electrode terminals 12a, 14a, 16a of the passive device 12 and the active devices 14, 16 are positioned on the flat upper face of the support member 10. In order to align the positions of the surfaces of the electrode terminals 12a, 14a, 16a of the electronic components, preferably, the adhesive agent layer 20 is as thin as possible (for example, about several to several tens of μm), and hard. The material of the adhesive agent layer 20 is preferably one which is slightly strong in adhesive force, and which does not contaminate the surfaces of the electrode terminals 12a, 14a, and 16a. For example, TRM tape manufactured by NITTO DENKO CORPORATION, REVALPHA (registered trademark) manufactured by NITTO DENKO CORPORATION, or the like may be used as the material of the adhesive agent layer 20.

Figure 2B:
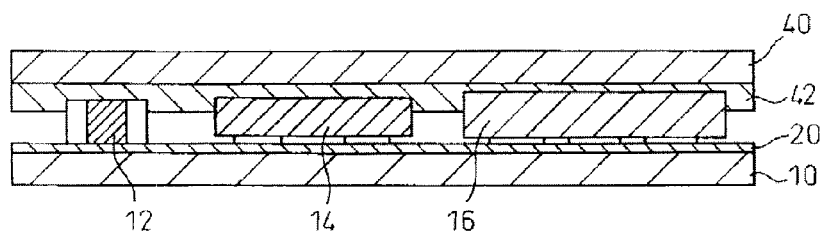

Referring to FIG. 2B, next, a second support member 40 which has an adhesive agent layer 42 in one face is placed so that the adhesive agent layer 42 is pressure bonded to the back faces of the electronic components on the first support member 10. The back faces are on the side which is opposite to the electrode terminals 12a, 14a, and 16a of the electronic components. In order to absorb a difference in thickness of the electronic components such as the passive device 12 and the active devices 14, 16, i.e., that in height of the back faces of the electronic components, preferably, the adhesive agent layer 42 is thickened to some extent (for example, a thickness of about several tens to several hundreds of μm). At the timing of pressure bonding to the components, preferably, the adhesive agent layer 42 is in a semi-liquefied state (at ordinary temperature or in a heated condition), and exerts an adhesive force which is slightly stronger. A material which can be peeled as a result of application of ultraviolet (UV) rays, heat, or the like is used.

Figure 2C:
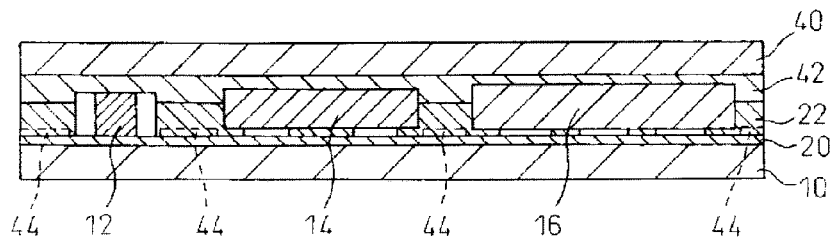

Referring to FIG. 2C, next, a resin 22 is injected into a gap between the adhesive agent layer 20 of the first support member 10 and the adhesive agent layer 42 of the second support member 40, thereby sealing the electronic components such as the passive device 12 and the active devices 14, 16. As the resin 22 which is used for sealing, a liquid resin which has a high filling property is used. A molding material, an underfill material, or the like which can be filled with the resin 22 is used between the components and the terminals. Preferably, the resin 22 which is used for sealing has small curing and shrinkage properties and a small coefficient of thermal expansion, and exerts a high sealing force.

In the step of FIG. 2C, as required, a conductor reinforcing layer or reinforcing plates 44 are previously bonded to places on the first support member 10 where the electronic components are not placed, through the adhesive agent layer 20, and, when the resin 22 is injected for sealing, integrated with the sealing resin 22. According to the configuration, the electronic components such as the passive device 12 and the active devices 14, 16 can be held more strongly by the sealing resin 22.

Figure 2D:
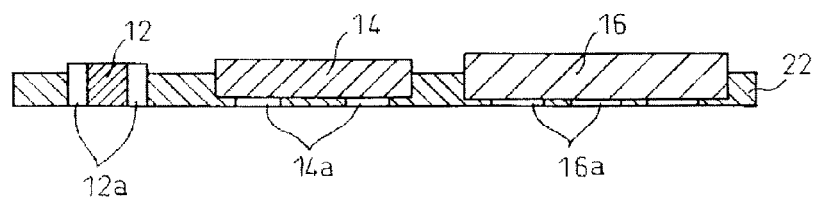

Referring to FIG. 2D, after the sealing resin 22 cures, the first support member 10 and the second support member 40 are peeled from the package configured by the electronic components and the sealing resin 22. In this case, also the adhesive agent layer 20 on the first support member 10 and the adhesive agent layer 42 on the second support member 40 are simultaneously peeled away.

Therefore, a structure is formed where the electrode terminals 12a, 14a, 16a of the electronic components such as the passive device 12 and the active devices 14, 16 are exposed from one face of the sealing resin 22, and the back faces of the electronic components are exposed from the other face of the sealing resin 22. Furthermore, a structure where the surfaces of the electrode terminals 12a, 14a, 16a of the electronic components are uniformly aligned in the same plane on the one face of the sealing resin 22 is obtained.

Figure 3A:
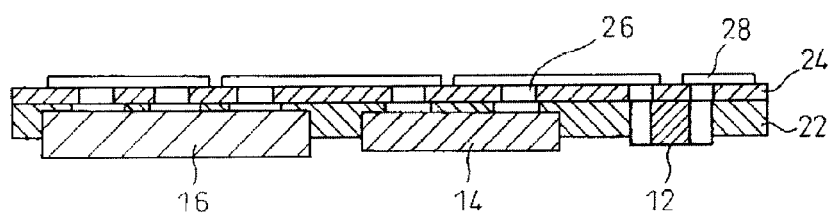
FIGS. 3A to 3C are process step diagrams showing the method of producing a resin-sealed package of the present invention, and subsequent to the steps of FIGS. 2A to 2D.

Referring to FIG. 3A, then, a resin layer 24 is formed on the side of the electrode terminals 12a, 14a, 16a of the electronic components, vias 26 are formed in the resin layer 24, and resin layers 24 and wiring layers 28 are alternately stacked to form the package as a multilayer structure.

Figure 3B:
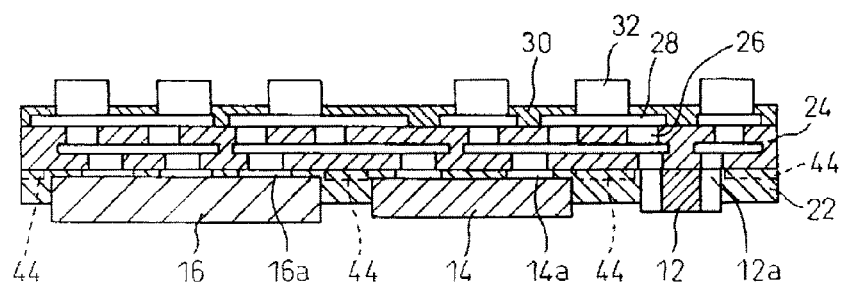

Referring to FIG. 3B, a solder resist layer 30 and the like are formed on the outermost surface of the package. Moreover, external terminals 32 which are passed through the solder resist layer 30 are formed, thereby completing the package. As required, the conductor reinforcing layer or reinforcing plates 44 which reinforce the sealing resin 22 may be disposed. The conductor reinforcing layer or reinforcing plates 44 can be formed by inserting them in the resin injecting step in the resin seal shown in FIG. 2C.

Figure 3C:
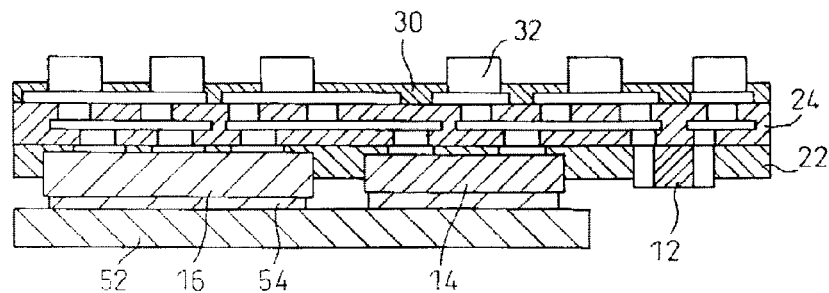

In the case where the passive device 12 and the active devices 14, 16 include a heat-radiating component, as required, a heat sink 52 or the like is connected to the back faces of the components which are exposed (in the exemplary embodiment, the active devices 14, 16), through an adhesive agent layer 54 as shown in FIG. 3C. According to the configuration, the heat radiation property of a heat-radiating component mounted in the package can be improved.

An adhesive force of the adhesive agent layer 20 of the first support member 10 is weaker than an adhesive force of the second adhesive agent layer 42 of the second support member 40. The first support member 10 is peeled from the package while the second support member 40 is fixed. Therefore, the first support member 10 can be easily peeled from the package since the adhesive force of the adhesive agent layer 20 is weaker than that of the second adhesive agent layer 42.

In the exemplary embodiment, the terminal sides of the one or plurality of electronic components are temporarily fixed to the surface of the first support member by the first adhesive agent layer, the back face sides of the electronic components are fixed by the second support member having the second adhesive agent layer, and the resin is injected while interposing the electronic components between the first support member and the second support member. Therefore, the electronic components have a structure which is approximately vertically symmetrical, and it is possible to obtain a package in which the degree of warpage is relatively small. Since the degree of warpage of the package is small, the terminal faces of the electronic components can be easily flattened, and a micro-wiring layer can be formed. Since the structure where the back faces of the electronic components are exposed from the sealing resin is formed, a heat-dissipating component such as a heat sink can be disposed. In the invention, even in a state where the back faces of electronic components having different thicknesses are exposed, the flatness is ensured by the second support member, and an excellent formation of a sealing resin is enabled.

Although the exemplary embodiment of the present invention has been described with reference to the accompanying drawings, the invention is not restricted to the above-described embodiment, and various modes, modifications, changes, and the like may be made without departing from the spirit and scope of the invention.

For example, the exemplary embodiment in which the plurality of electronic components such as the passive device 12 and the active devices 14, 16 are mounted in the package has been described. Alternatively, the present invention may be configured by one electronic component which is one of the passive device 12 and the active devices 14, 16.

As described above, the micro-wiring package and its production method of the present invention can be applied to any semiconductor package having a single or plurality of active or passive devices, and can realize a fine pitch in an electronic component.

What is claimed is:

1. A resin-sealed package comprising:
    a plurality of electronic components each having a first electronic component face on which a terminal is formed, a second electronic component face opposite to the first electronic component face, and a side electronic component face connecting the first electronic component face and the second electronic component face, wherein the electronic components have heights different from one another;
    a sealing resin which collectively seals the side electronic component faces of the electronic components from the first electronic component faces toward the second electronic component faces, the sealing resin directly abuts and covers an entirety of side surfaces of each of the terminals and first electronic component faces, a first terminal surface of each of the terminals is exposed from a first resin face of the sealing resin, the exposed first terminal surface of each of the terminals being opposite to a second terminal surface which is provided on and faces the first electronic component face of the electronic component, wherein the first resin face of the sealing resin is flush with the exposed first terminal surface of each of the terminals to enable an electrical connection to each of the terminals, and wherein a second resin face of the sealing resin is recessed from the second electronic component faces of the electronic components to expose an upper part of the side electronic component faces of the electronic components; and
    a laminated structure which is formed by laminating an insulating resin layer and a wiring layer electrically connected to the terminals, on the sealing resin,
    wherein a reinforcing member is embedded in the sealing resin at the first resin face thereof so as to face the laminated structure, one face of the reinforcing member being disposed between adjacent electronic components and flush with the first resin face of the sealing resin and the exposed first terminal surface of the terminals.

2. A resin-sealed package according to claim 1, wherein the reinforcing member is a reinforcing plate.

3. A resin-sealed package comprising:
    a plurality of electronic components each having a first electronic component face on which a terminal is formed, a second electronic component face opposite to the first electronic component face, and a side electronic component face connecting the first electronic component face and the second electronic component face, wherein the electronic components have heights different from one another;
    a sealing resin which collectively seals the side electronic component faces of the electronic components from the first electronic component faces toward the second electronic component faces, the sealing resin directly abuts and covers an entirety of side surfaces of each of the terminals and first electronic component faces, a first terminal surface of each of the terminals is exposed from a first resin face of the sealing resin, the exposed first terminal surface of each of the terminals being opposite to a second terminal surface which is provided on and faces the first electronic component face of the electronic component, wherein the first resin face of the sealing resin is flush with the exposed first terminal surface of each of the terminals to enable an electrical connection to each of the terminals, and wherein a second resin face of the sealing resin is recessed from the second electronic component faces of the electronic components to expose an upper part of the side electronic component faces of the electronic components; and a laminated structure which is formed by laminating an insulating resin layer and a wiring layer electrically connected to the terminals, on the sealing resin, wherein a reinforcing member is embedded in the sealing resin at the first resin face thereof so as to face the laminated structure, one face of the reinforcing member is flush with the first resin face of the sealing resin and the exposed first terminal surface of the terminals, the reinforcing member is disposed between adjacent electronic components, and the reinforcing member is a conductor reinforcing layer.

4. A resin-sealed package according to claim 1, wherein a heat radiating component is connected to the second electronic component face of each of the electronic components, the heat radiating component having a continuous planar surface which faces and is overlaid by each of the electronic components, and a distance between the continuous planar surface and each of the second electronic component faces is different, said distance measured along a line that is perpendicular to the continuous planar surface of the heat radiating component and the second electronic component faces.

5. A resin-sealed package according to claim 1, wherein the height of each electronic component is measured between the first electronic component face and the second electronic component face.

6. A resin-sealed package according to claim 3, wherein a heat radiating component is connected to the second electronic component face of each of the electronic components, the heat radiating component having a continuous planar surface which faces and is overlaid by each of the electronic components, and a distance between the continuous planar surface and each of the second electronic component faces is different, said distance measured along a line that is perpendicular to the continuous planar surface of the heat radiating component and the second electronic component faces.

7. A resin-sealed package according to claim 3, wherein the height of each electronic component is measured between the first electronic component face and the second electronic component face.

8. A resin-sealed package according to claim 1, wherein the one face of the reinforcing member contacts the insulating resin layer of the laminated structure.

* * * * *